United States Patent
Castelli et al.

(10) Patent No.: US 7,873,485 B2
(45) Date of Patent: Jan. 18, 2011

(54) INDICATING PHYSICAL SITE ENERGY USAGE THROUGH A VIRTUAL ENVIRONMENT

(75) Inventors: Vittorio Castelli, Croton on Hudson, NY (US); Rick A. Hamilton, II, Charlottesville, VA (US); Clifford A. Pickover, Yorktown Heights, NY (US); Robert Wisniewski, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 281 days.

(21) Appl. No.: 12/117,348

(22) Filed: May 8, 2008

(65) Prior Publication Data

US 2009/0281886 A1  Nov. 12, 2009

(51) Int. Cl.
*G06F 19/00* (2006.01)
(52) U.S. Cl. ....................................................... 702/61
(58) Field of Classification Search .................... 702/61, 702/64, 182–185, 188
See application file for complete search history.

(56) References Cited

U.S. PATENT DOCUMENTS

| | | | |
|---|---|---|---|
| 5,736,990 A | 4/1998 | Barrus et al. | |
| 5,879,236 A | 3/1999 | Lambright | |
| 6,256,043 B1 | 7/2001 | Aho et al. | |
| 6,327,541 B1 | 12/2001 | Pitchford et al. | |
| 6,598,029 B1 | 7/2003 | Johnson et al. | |
| 6,631,309 B2 | 10/2003 | Boies et al. | |
| 6,767,287 B1 | 7/2004 | Mcquaid et al. | |
| 6,785,592 B1 | 8/2004 | Smith et al. | |
| 6,937,946 B1 | 8/2005 | Culp et al. | |
| 7,096,360 B1 | 8/2006 | Fries | |
| 7,135,956 B2 | 11/2006 | Bartone et al. | |
| 7,171,287 B2 | 1/2007 | Weiss | |
| 7,358,973 B2 | 4/2008 | Herbrich et al. | |
| 2002/0062177 A1 | 5/2002 | Hannaford et al. | |
| 2003/0057884 A1 | 3/2003 | Dowling et al. | |
| 2004/0098142 A1 | 5/2004 | Warren et al. | |
| 2004/0254899 A1 | 12/2004 | Abe et al. | |
| 2005/0033601 A1* | 2/2005 | Kirby et al. ..................... 705/1 |

(Continued)

FOREIGN PATENT DOCUMENTS

JP        2003061263        2/2003

OTHER PUBLICATIONS

Trefftz, Helmuth et al., "Local and Global Impact of Message Caching in Shared Virtual Environments", *Proceedings of the IASTED International Conference on Computer Graphics and Imaging 2000 (CGIM 2000)* Las Vegas, NV Nov. 20, 2000, 8-13.

(Continued)

*Primary Examiner*—Edward Raymond
(74) *Attorney, Agent, or Firm*—DeLizio Gilliam, PLLC

(57) ABSTRACT

Real world energy usage can be reduced using a virtual environment. A virtual universe energy conservation system ("system") can determine comprehensive energy usage at a physical site where a client accessing a virtual universe is located. The system can determine that the comprehensive energy usage at the physical site exceeds an energy usage threshold. The system can also notify a virtual universe user account associated with the client that the comprehensive energy usage at the physical site exceeds the energy usage threshold.

20 Claims, 5 Drawing Sheets

U.S. PATENT DOCUMENTS

| | | |
|---|---|---|
| 2005/0165512 A1 | 7/2005 | Peljto |
| 2006/0135261 A1 | 6/2006 | Kinne et al. |
| 2007/0061201 A1 | 3/2007 | Ellis et al. |
| 2007/0097206 A1 | 5/2007 | Houvener et al. |
| 2007/0219645 A1 | 9/2007 | Thomas et al. |
| 2007/0244604 A1 | 10/2007 | McNally |
| 2008/0177423 A1* | 7/2008 | Brickfield et al. ........... 700/291 |
| 2009/0109229 A1 | 4/2009 | Hamilton, II et al. |
| 2009/0113338 A1 | 4/2009 | Hamilton, II et al. |
| 2009/0113421 A1 | 4/2009 | Hamilton, II et al. |
| 2009/0278841 A1 | 11/2009 | Hamilton, II et al. |
| 2009/0281743 A1 | 11/2009 | Hamilton, II et al. |
| 2009/0281885 A1 | 11/2009 | Castelli et al. |
| 2010/0050004 A1 | 2/2010 | Hamilton, II et al. |
| 2010/0052872 A1 | 3/2010 | Boss et al. |
| 2010/0057529 A1 | 3/2010 | Boss |
| 2010/0057625 A1 | 3/2010 | Boss et al. |
| 2010/0057641 A1 | 3/2010 | Boss et al. |
| 2010/0058350 A1 | 3/2010 | Boss et al. |
| 2010/0083107 A1 | 4/2010 | Allen et al. |

OTHER PUBLICATIONS

U.S. Appl. No. 11/931,826, Hamilton, II, Rick A.
U.S. Appl. No. 11/932,114, Hamilton, II, Rick A.
U.S. Appl. No. 11/932,319, Hamilton, II, Rick A.
U.S. Appl. No. 12/115,963, Hamilton, II, Rick A.
U.S. Appl. No. 12/194,633, Hamilton, II, Rick A.
U.S. Appl. No. 12/203,329, Hamilton, II, Rick A.
U.S. Appl. No. 12/203,345, Hamilton, II, Rick A.
U.S. Appl. No. 12/203,366, Hamilton, II, Rick A.
U.S. Appl. No. 12/203,379, Hamilton, II, Rick A.
U.S. Appl. No. 12/203,399, Hamilton, II, Rick A.
U.S. Appl. No. 12/239,378, Hamilton, II, Rick A.
"U.S. Appl. No. 11/932,114 Office Action", Oct. 29, 2010, 18 pages.
"U.S. Appl. No. 12/115,958 Office Action", Oct. 28, 2010, 13 pages.

* cited by examiner

INDICATING PHYSICAL SITE ENERGY USAGE THROUGH A VIRTUAL ENVIRONMENT

CROSS-REFERENCE TO RELATED APPLICATIONS

This application is related to U.S. patent application Ser. No. 12/115,963, titled "MANAGING USE LIMITATIONS IN A VIRTUAL UNIVERSE RESOURCE CONSERVATION REGION," U.S. patent application Ser. No. 12/115,958, titled "MANAGING ENERGY USAGE BY DEVICES ASSOCIATED WITH A VIRTUAL UNIVERSE RESOURCE CONSERVATION REGION," and U.S. patent application Ser. No. 12/117,360, titled "USING VIRTUAL ENVIRONMENT INCENTIVES TO REDUCE REAL WORLD ENERGY USAGE."

BACKGROUND

Embodiments of the inventive subject matter relate generally to virtual universe systems that, more particularly, indicate energy usage at a physical site through a virtual environment.

Virtual universe applications allow people to socialize and interact in a virtual universe. A virtual universe ("VU") is a computer-based simulated environment intended for its residents to traverse, inhabit, and interact through the use of avatars. Many VUs are represented using 3-D graphics and landscapes, and are populated by many thousands of users, known as "residents." Other terms for VUs include metaverses and "3D Internet."

SUMMARY

Real world energy usage can be reduced using a virtual environment. A virtual universe energy conservation system ("system") can determine comprehensive energy usage at a physical site where a client accessing a virtual universe is located. The system can determine that the comprehensive energy usage at the physical site exceeds an energy usage threshold. The system can also notify a virtual universe user account associated with the client that the comprehensive energy usage at the physical site exceeds the energy usage threshold.

BRIEF DESCRIPTION OF THE DRAWING(S)

The present embodiments may be better understood, and numerous objects, features, and advantages made apparent to those skilled in the art by referencing the accompanying drawings.

DESCRIPTION OF THE EMBODIMENT(S)

The description that follows includes exemplary systems, methods, techniques, instruction sequences and computer program products that embody techniques of the present inventive subject matter. However, it is understood that the described embodiments may be practiced without these specific details. For instance, although examples refer to energy conservation, embodiments can be used to conserve other natural resources (e.g., water, gas, etc.) In other instances, well-known instruction instances, protocols, structures and techniques have not been shown in detail in order not to obfuscate the description.

Introduction

Figure 1:
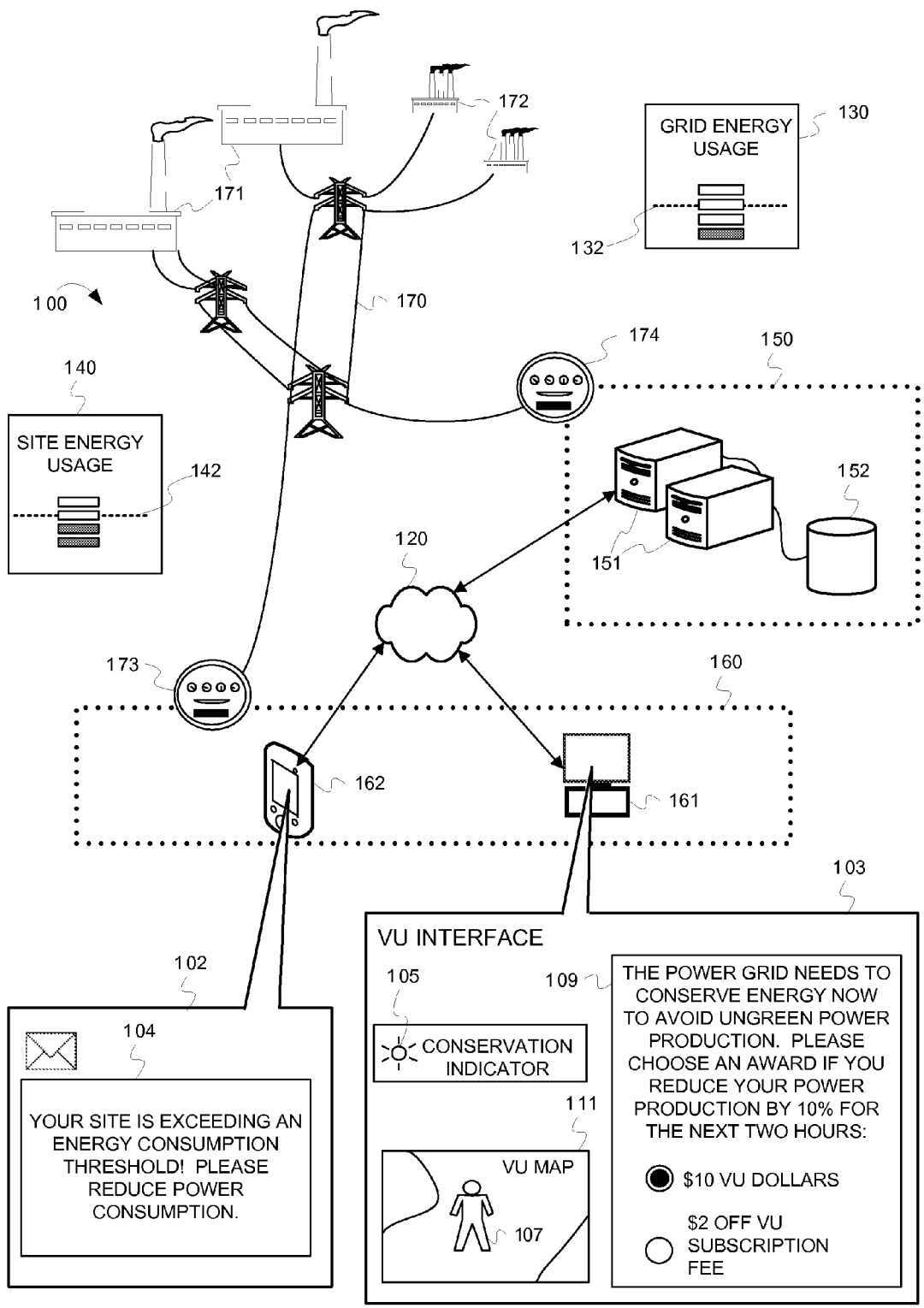
FIG. 1 is an example illustration of using a virtual environment to conserve energy usage on a power grid and to conserve energy use at physical sites associated with the virtual environment.

VU users can often be found immersed in a virtual world, but they represent real-life individuals that consume real-life resources. For example, a typical VU user runs at least one computer device on a regular basis to access the VU, which consumes electrical power. VU users also utilize many other power consuming devices within their households, places of business, and public meeting places. Many energy providers (e.g., electric companies) create electricity by consuming natural resources and provide the energy to an electrical grid that covers a vast geographic area. The energy providers, however, usually create some environmental pollutants when they create electricity. Some energy providers are more clean and efficient, or "green" than others. "Greenness" is a shorthand term that describes a measure of some thing's impact on the environment. The more "green" some thing is, the more environmentally friendly it is considered to be. Because of regulatory and social pressures, large energy providers typically strive to generate electrical energy that is as green as practically possible. Other energy providers, however, usually smaller energy providers, are not as environmentally conscientious, and the energy that they produce is ungreen. FIG. 1 shows how a computer system, according to some embodiments, can utilize a virtual universe to reduce the production and use of energy, specifically ungreen electrical energy.

FIG. 1 is an example illustration of using a virtual environment to conserve energy usage on a power grid and to conserve energy use at physical sites associated with the virtual environment. In FIG. 1, a virtual universe energy conservation system ("system") 100 includes power consuming devices, such as client site devices (e.g., a computer client 161 and mobile client 162) and server site devices (e.g., servers 151 and database 152) that support a virtual universe ("VU") network. The servers 151 serve the VU network by processing and providing data that the computer client 161 can receive, via a communication network 120, then process to render a VU display 103. The database 152 can store VU user account information associated with VU avatars (e.g., avatar 107) displayed within the VU display 103. The VU display 103 can present a graphical user interface (GUI) with a map display 111, inventory controls, configuration settings, chat screens, etc.

The system 100 is configured to monitor energy use associated with a VU. For example, the system 100 can monitor energy use on an electrical grid 170 and report the energy usage within a VU interface on the VU display 103. The system 100 can monitor energy production by multiple energy providers 171, 172, connected to the electrical grid 170. Some energy providers, such as large energy providers 171, can produce large amounts of energy. The large energy providers 171 may create energy in ways that are highly regulated, and therefore may meet stringent cleanliness standards. As a result, the large energy providers 171 can produce energy with fewer environmental pollutants, per energy unit production, than other energy providers. However, at times of peak power usage on the electrical grid 170, the large energy providers 171 may not be able to produce enough energy for use on the electrical grid 170. As a result, some smaller and/or less regulated energy providers 172 may increase their energy production to add needed power to the electrical grid 170. However, these smaller and/or less regulated energy providers 172 may produce more environmental pollutants, per energy unit production, than the larger, more regulated energy providers 171. Consequently, the system 100 can monitor energy production from the different providers 171, 172, and know which providers produce cleaner, or more green energy. The system 100 anticipates, or projects, when the ungreen energy providers may need to increase production. For example, the system 100 can monitor grid energy use with a gauge 130. The grid energy use gauge 130 can have an energy use threshold 132 associated with the gauge 130. The energy use threshold 132 is a measurement limit that can correspond to a grid energy peak, which results in ungreen energy production. The system 100 can adjust the energy use threshold 132 based on short-term and long-term conditions (e.g., seasonal conditions, environmental conditions, special events, population growth, etc.) To prevent energy use from peaking, the system 100 can incentivize VU user accounts to reduce energy use on the electrical grid 170 to prevent the production of the ungreen energy. For example, the system 100 can present an offer 109 of awards that the VU user account can redeem for reducing energy usage. The energy monitoring device 173 can detect when energy usage reduces during a specified time period (e.g., during a peak-use period, before a peak-use period, until the gauge 130 measures a set drop in site energy usage, until the gauge 130 measures a drop below the threshold 132, etc.)

In another example, the system 100 can monitor energy use at a physical site (e.g., client site 160 and/or server site 150), and report the energy usage to the clients 161, 162. In some embodiments, the system 100 can measure the site energy usage using energy monitoring devices 173, 174, that can be positioned at the physical sites 160, 150. The energy monitoring devices 173, 174 can also be positioned anywhere else on the electrical grid 170, such as at the energy providers 171, 172. Further, the energy monitoring devices 173, 174 can be software, hardware, or any combination thereof. The energy usage measured by the monitoring devices 173, 174 can be presented on a gauge 140 that measures an energy usage threshold ("threshold") 142. The threshold 142 indicates an arbitrary level of energy usage. The threshold 142 can be set by a VU user account, a VU administrator, a regulatory group, etc., to assist a VU user account to track energy usage at the physical. The client site 160 can include multiple devices that utilize energy (e.g., television, home appliances, HVAC, etc.), including the clients 161, 162. The system can monitor the energy usage of all devices at the client site 160 and determine when the energy usage is approaching the threshold 142. The system 100 can then notify the VU user account via the clients 162, 161. One way to notify the VU user account is to send a message 104 (e.g., email, text, chat, audio file, pop-up, etc.). The message 104 can appear on a display 102 on the client device 162. Another way to notify the VU user account is to display an indicator 105 (e.g., a light, a text message, a status bar indicator, a pop-up, an audible sound, etc.) within the VU interface on the VU display 103. In some embodiments, the system 100 can force a reduction in energy usage by the client site devices 161, 162 and/or by the server site devices 151, 152 to maintain energy usage within the thresholds 132, 142.

Example Operations

This section describes operations associated with some embodiments. In the discussion below, some flow diagrams are described with reference to block diagrams presented herein. However, in some embodiments, the operations can be performed by logic not described in the block diagrams.

In certain embodiments, the operations can be performed by executing instructions residing on machine-readable media (e.g., software), while in other embodiments, the operations can be performed by hardware and/or other logic (e.g., firmware). Moreover, some embodiments can perform more or less than all the operations shown in any flow diagram.

Figure 2:
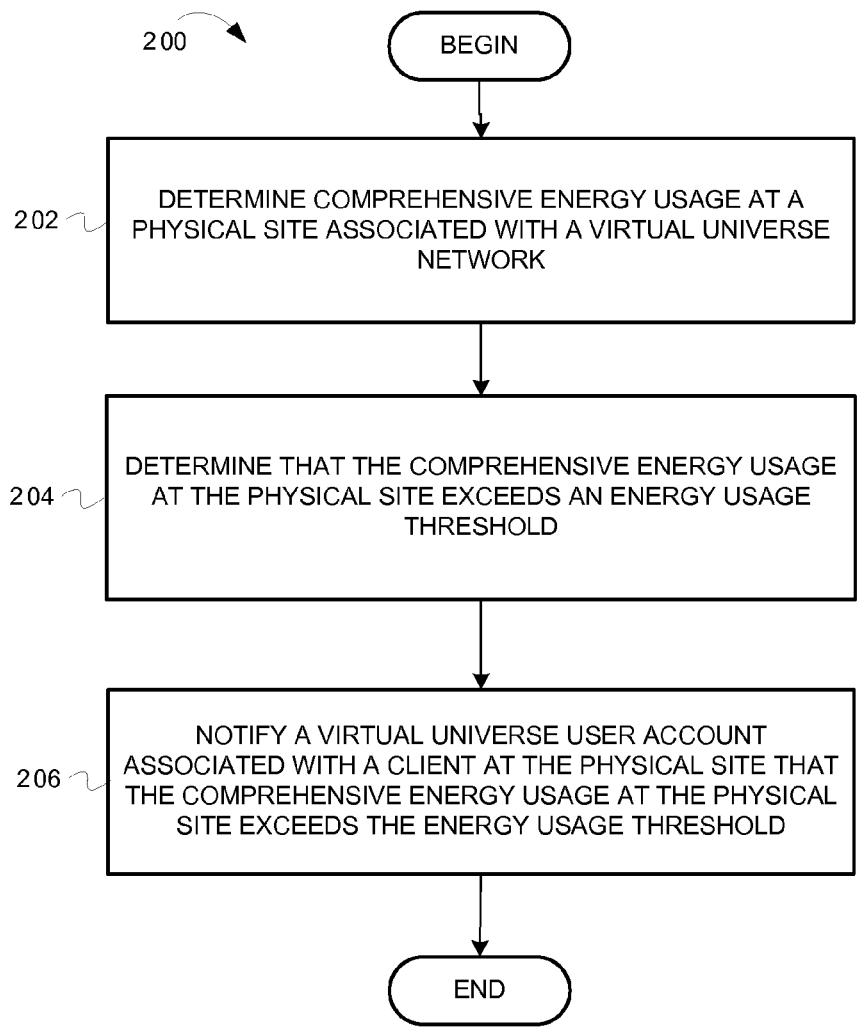
FIG. 2 is an example flow diagram 200 illustrating using a virtual environment to notify a VU user account about energy usage at a physical site.

FIG. 2 is an example flow diagram illustrating using a virtual environment to notify a VU user account about energy usage at a physical site. In FIG. 2, the flow 200 begins at processing block 202, where a virtual universe energy conservation system ("system") determines a comprehensive energy usage at a physical site associated with a VU network. The system can determine comprehensive energy usage in many different ways. For example, the system can determine energy usage from any one, or both, of a client site and a server site, such as the client site 160 and the server site 150 described in FIG. 1. The system can also detect energy usage by physical devices running throughout a network connecting the client site with the server site. The system can determine historical energy usage (e.g., average energy usage, usage during peak-periods, usage during non-peak periods, etc.), current energy usage, forecast energy usage, or a mixture of historical, present and forecast energy usages, to compute comprehensive energy usage. The system can determine energy usage by combining energy usage from multiple physical sites. The system can also determine energy usage from a single site where the VU user account is connected to the VU network, such as physical sites that are controlled by a VU user account (e.g., a home, a personal business, etc.), or from public and private physical site locations where the VU user account is merely connected to a local communications network (e.g., a coffee shop, a library, a work place, etc.) Comprehensive energy can refer to the energy utilized by all devices at the single physical site. The various physical sites can receive energy from different providers on an electrical grid. The various sites can also have different pricing structures for the energy. Regardless, however, of how the sites receive power and/or are billed for power, the system can aggregate energy usage data and utilize the aggregated data to determine comprehensive energy usage.

The flow 200 continues at processing block 204, where the system indicates that the comprehensive energy usage at the physical site exceeds an energy usage threshold. The system can monitor electrical energy usage by devices at the physical site. For example, as described previously in FIG. 1, the system can use monitoring devices and gauges to determine power usage at the physical site. In other embodiments, the system can utilize software to extract energy usage data from databases and compute historical energy usage for the physical site. The system can then associate the historical energy usage with a scale that indicates the historical energy usage. The system can assign an energy usage threshold as a lower limit to a high-end measurement range of the scale. The system can determine when current energy usage at the physical site approaches and/or surpasses the energy usage threshold. The physical site may be on a localized electrical network or circuit. The system can measure power consumption for all power consuming devices on the circuit, not just VU client devices accessing the electrical circuit.

Figure 3:
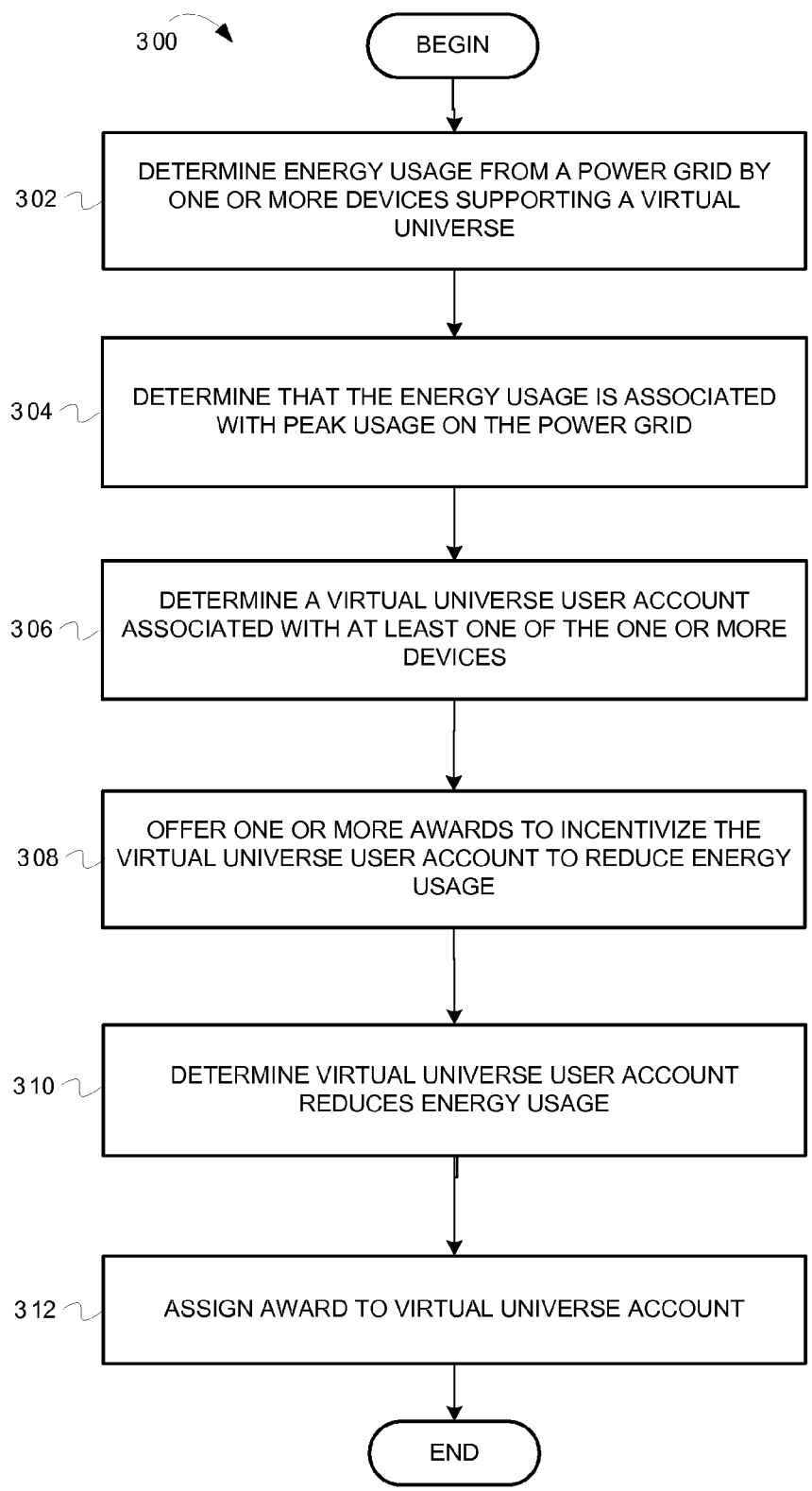
FIG. 3 is an example flow diagram 300 illustrating monitoring power statistics on an electrical grid and incentivizing VU user accounts to reduce power usage on the grid.

The flow 200 continues at processing block 206, where the system notifies a virtual universe account associated with a client at the physical site that the comprehensive energy usage at the physical site exceeds the energy usage threshold. The system can provide one or more notifications to the VU user account, either within the virtual universe or outside the virtual universe. For example, the system can provide images, sounds, etc. through a VU GUI. The system can also send emails, text messages, voice messages, telephone calls, chat messages, pop-up windows, etc. The system can notify an avatar within the VU, by presenting a notification that appears within a VU region or area (e.g., the sky of the region changes color, a light blinks on an avatar's apparel, an avatar character appears, a message pops up, etc.) In some embodiments, the system can store the energy use information in a format accessible by the VU user account. The VU user account can then access that information on demand. The system can also offer an award to the VU user account to reduce power usage at the physical site, or to reduce VU usage within the VU. FIG. 3 describes some potential awards in more detail. The system can also determine when physical sites utilize localized devices (e.g., solar energy cells) that use clean and/or renewable energy sources to augment the power grid. The system can award VU user accounts for utilizing the renewable energy sources and/or offer incentives for VU user accounts to implement devices within their physical sites that can utilize renewable energy sources.

In some embodiments, the operations can be performed in series, while in other embodiments, one or more of the operations can be performed in parallel. For example the system can determine energy usage before, during, and after notifying the VU user account.

FIG. 3 is an example flow diagram illustrating monitoring power statistics on an electrical grid and incentivizing VU user accounts to reduce power usage on the grid. In FIG. 3, the flow 300 begins at processing block 302, where a virtual universe energy conservation system ("system") determines energy usage from a power grid by one or more devices supporting a virtual universe. The system can obtain energy usage information for the power grid by requesting the information from energy providers. The energy providers can provide energy production and consumption data in real-time or delayed time. The system can receive the data from the providers and compute an overall power usage value that the system can display on a gauge or a meter. The system can monitor energy usage in many different ways (e.g., power production, production versus consumption, power production per energy unit, average power consumption per household, etc.) Regardless of the way the energy usage is measured, however, the system can measure the energy usage on a scale and associate a usage threshold value. The system can monitor the energy usage on the scale to determine the status of the energy usage in relation to the threshold value.

The flow 300 continues at processing block 304, where the system determines that the energy usage is associated with a peak usage on the power grid. The system can determine different types of peak usage. In some embodiments, the system can determine when a period of "peak power" or "peak energy" usage is about to occur, based on gauge measurements, meters, historical data, etc. Peak energy usage can lead to problems on the grid, such as brown-outs and black-outs. The system is configured to prevent those types of problems. In some embodiments, the system can determine when a peak usage of "ungreen" power occurs. For example, one way is for the system to determine the "peak power" or "peak energy" usage, as stated previously. Peak power usage is typically an indication of when the grid is using the least green (i.e., most ungreen) power (e.g., the grid relies on more highly polluting and/or inefficient energy providers to meet peak power needs). Another way for the system to determine peak usage is to monitor the cost of energy on the market. For example, when energy is at its highest cost may indicate that the electrical grid is overburdened and/or relying on ungreen power providers. The system can also compare a current energy usage to previous usage history, or use in similar situations. For example, the system can anticipate, or project, when a peak usage (e.g., peak energy usage, peak ungreen power usage, etc.) might be used on the electrical grid based on a history of past usage, on current energy use trends, on energy prices, etc. For example, the system can compare a daily "spot" price with a running average energy use. A "spot" price is the price that is quoted for immediate (hence "spot") settlement (i.e., payment and delivery) of a commodity (e.g., power), security, or currency. The spot price in the US is determined by the wholesale electricity market, the purpose of which is to allow trading of electric power between generators, financial intermediaries, and retailers. The spot price for power is typically determined in the day-ahead market (that is, for the following day) for hourly intervals. Hence, a spot price for electrical power is determined every day for each hour of the following day. These prices are typically freely available from the web-sites of the agencies that manage the market (e.g., www.NYISO.com for New York State). In addition to day-ahead auctions, real-time auctions can also be used as means for procuring electrical power. In real-time auctions, the energy consumption estimates used in the day-ahead market are recalculated for each 5 minute, ½ hour, or 1 hour interval of the day (depending on the specific market) to obtain better estimates that take into account real-time considerations, such as unexpected outages of power plants. These auctions determine the real-time spot-price of electrical power. The system can also subscribe to data from specific agencies that provide information about short-term estimates of the power demand, such as from an independent system operator (ISO), or a regional transmission organization (RTO). The system can gather the information over a communications network, like the Internet. The system can obtain the cost of electric power from an energy market via the Internet. The system can obtain this information by using an automated agent. The system can also track the energy produced and/or energy provided (e.g., as stored energy introduced into the electrical grid) of providers that typically produce energy using high amounts of pollutants. The providers can be rated according to the type of energy they provide (e.g., coal burning, hydroelectric, etc.) for its cleanliness and impact on the environment. The system can use the rating as part of its determinations of peak ungreen power usage. The system can also adjust determinations for periodic or seasonal variations as well as energy use anomalies.

In one embodiment, the system can collect information and convert it into indexes denoting values such as the cost of the energy, the demand for the energy and the greenness of the energy. The system can then store the indexes in a database and access the database when needed. The system can manipulate the data into a format that a VU user can easily understand. For example, the system can provide indicator lights on a VU GUI (e.g., blue light for low energy use on the grid, green light for normal energy usage on the grid, red light for high energy usage on the grid). The system can use similar indicators to indicate other factors, such as cost of energy on the grid and/or greenness of energy production on the grid.

The flow 300 continues at processing block 306, where the system determines a virtual universe user account associated with at least one of the one or more devices. The system can determine when a user is connected to the virtual network by detecting the location of a client device that has logged in to a VU using a VU user account. The system can determine the physical location of the client device that has logged in to the VU by querying the client device for an IP address, or other network location identifier, and determining what physical site the IP address is registered to. The system can query one or more network devices (e.g., routers, domain servers, internet service providers, etc.) to determine the IP address and the physical location associated with the IP address. For example, if a generic IP address, or other locator, is dynamically assigned to a client device at the physical location, the system can query higher level devices, like servers and routers, until it finds a unique locator that is identifiable with the physical site. The system can also utilize global positioning devices and satellite services to determine the location of a client device. For example, a VU user account can store a mobile telephone number in a VU database. The system can access a telephone service provider to determine the location of a mobile device associated with the telephone number. The system can then use the location to determine the address for a physical site where the owner of the VU account is at. The system can then query an energy provider to access energy use data for the physical site associated with the address.

The flow 300 continues at processing block 308, where the system offers one or more awards to incentivize the VU user account to reduce energy usage. The system can determine if a VU user account may need, or would possibly respond favorably to, an incentive to reduce energy usage. For example, if a VU user account is currently logged into a VU and appears to be using a significant amount of electrical energy, the system can identify that VU user account as a candidate to receive an award offer. For example, the system can compare the VU user account's current power consumption with historical data, (e.g., usage for the same time of day, average usage, etc.) If the current consumption is near the top of a historical energy use range for that VU user account and there is a sufficient gap between the top and the bottom of the range, the VU user account may be identified as a VU user account that is currently overusing energy, and thus a candidate for an incentive.

Some examples of awards that can be used to incentive a VU user account may include VU money or credits, VU items, additional avatar abilities, reduction in subscription fees, carbon credits, temporary access to restricted areas of the VU, etc. The awards can also be associated with third parties. For instance, the awards can be electronic coupons redeemable at third party websites. The awards can also be generated directly by third parties that do business within the VU (e.g., by a VU store, by a VU marketing company, etc.) The system can determine user preferences stored on a profile for specific types of rewards that a VU user account may prefer. The system can present the awards based on the preferences. The system can also determine a VU user account's past history to determine awards. For example, if a VU user account has a history of energy over usage, the system may determine a very enticing award to offer the VU user account to entice the user account to become more conservation minded. As the VU user account lowers energy use, the system can offer less enticing awards as the VU user account becomes more environmentally aware. Alternatively, the system can offer more valuable awards to VU user accounts that have a history of energy conservation or a proposed commitment to conserve energy. The system can notify the VU user account of the awards that are available for conserving energy.

The system can offer awards to VU user accounts at various times. For example, the system can offer rewards when the system determines that the electrical grid needs to conserve energy, like during times of peak energy use. The system can also offer awards when a VU user account first logs on to the VU, when the VU user account becomes active again after a long period of inactivity, during pause periods such as while an avatar is teleporting within the VU, etc. The system can collect information on how VU user accounts respond to the offers, and use that information to train models (e.g., to plan incentives to optimize cost/power saving trade off, to personalize the incentives, to prioritize the VU user accounts to which incentive are offered, etc.)

The flow 300 continues at processing block 310, where the system determines that the VU user account reduces energy usage. The system can impose one or more conditions on the offer, such as to reduce power consumption during a specific time period and/or to meet a specific energy reduction goal (e.g., reduce power usage by 10% for 20 minutes, reduce usage until a peak-power usage time is over, reduce usage until an energy use measure falls below a use threshold, etc.) The system can monitor the power consumption on the power grid and monitor the energy usage by VU user account devices (e.g., in association with a physical site) to determine if the VU user account meets the reduction goal during the specified time period. As the VU user account takes actions to reduce energy consumption (e.g., by changing the air conditioner settings, by turning off lights, etc.) the system's instrumentation can gather information and present feedback that shows the VU user account's progress towards the energy reduction goal. The system can present the feedback within the VU, such as with meters (e.g., an avatar's health meter improves, an energy meter show energy reduction, an indicator light gradually turns from red to green, etc.) or with VU environmental changes (e.g., a region's sky color changes, leaves grow back on VU trees, etc.) Another way for the system to determine that the VU user account conserves energy is to determine whether the VU user account limits its utilization of the VU during the specified time period. For example, instead of, or in addition to, monitoring energy use by devices associated with the VU user account, the system can provide multiple ways for the VU user account to use less energy within the VU (e.g., limit the avatar's movements, reduce image quality of the VU, limit VU transactions, etc.) The system can determine that the VU user account adheres to the VU limitations for the specified time period. The system can also determine whether the VU user account does not accept the offer to reduce power usage. The system can penalize the VU user account for not reducing energy usage (e.g., increase subscription fees, remove avatar abilities, remove avatar items, restrict access to specific VU regions or areas, etc.)

The flow 300 continues at processing block 312, where the system assigns the award to the VU user account. When the VU user account reduces energy usage according to the conditions in the offer, the system can assign the award to the VU user account directly (e.g., put an item into the VU user account's inventory, assign special abilities or privileges to an avatar associated with the VU user account, add money to the VU user account, reduce subscription fees for the VU user account, etc.)

It should also be noted that while many of the embodiments described above relate to reduction of electrical energy usage, the system can also determine usage of other types of environmental resources (e.g., water usage, natural gas usage, etc.) and adapt the system to incentive VU user accounts to conserve the other types of resources.

In some embodiments, the operations can be performed in series, while in other embodiments, one or more of the operations can be performed in parallel. For example the system can offer one or more rewards before determining how much energy needs to be conserved on the electrical grid. The system can then adjust the value or payout of the award based on how much energy conservation is needed.

Additional Example Operating Environments

This section describes example operating environments, systems and networks, and presents structural aspects of some embodiments.

Example Virtual Universe Energy Conservation Network

Figure 4:
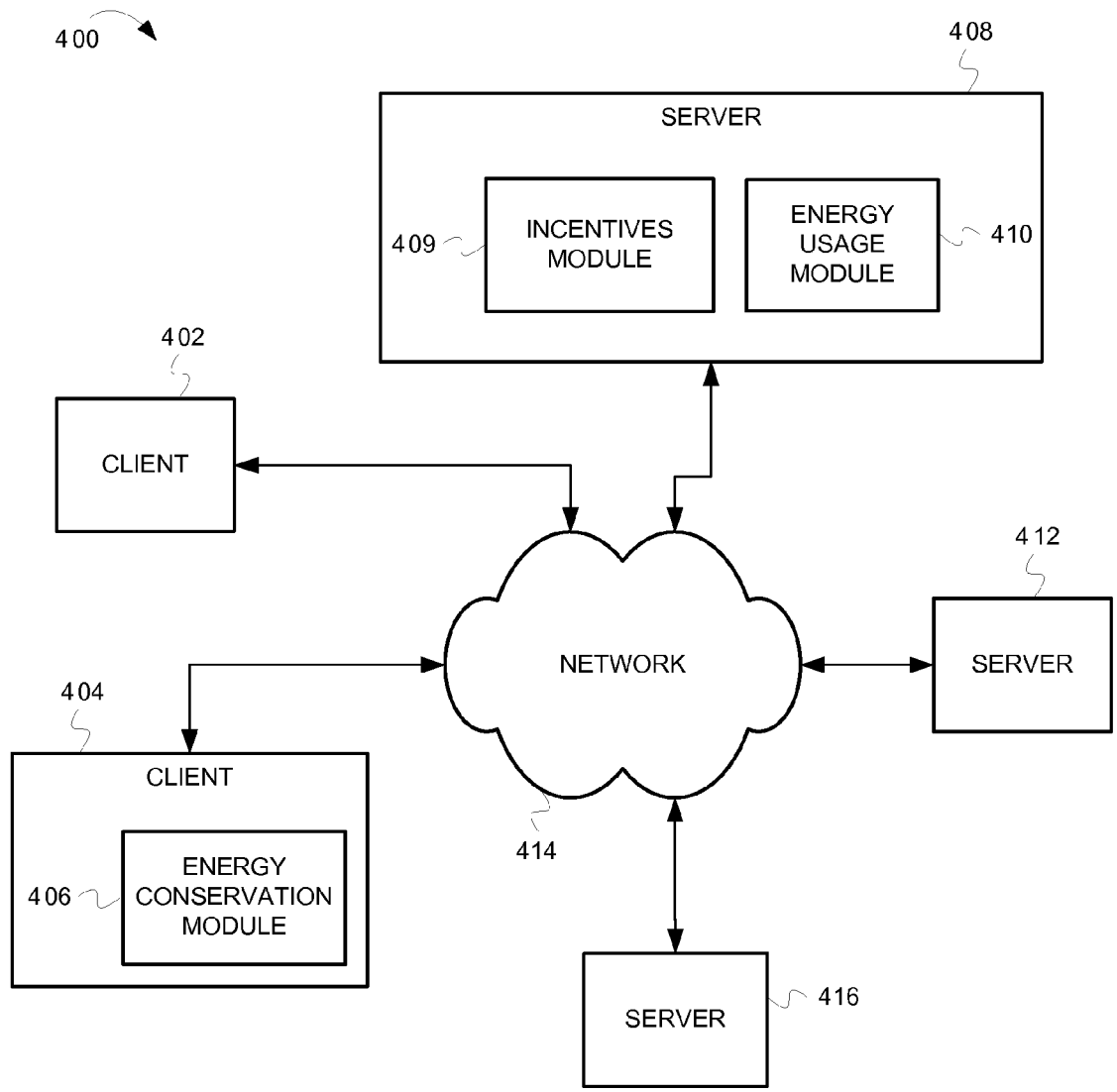
FIG. 4 is a block diagram illustrating an example networking environment.

FIG. 4 is a block diagram illustrating an example networking environment. A system 400 can include multiple client devices ("clients") 402 and 404 connected to multiple servers 408 and 412 via a network 414. The network 414 can be a local area network (LAN), a wide area network (WAN), a telephone network, such as the Public Switched Telephone Network (PSTN), an intranet, the Internet, or a combination of networks. For simplicity, the system 400 shows only two clients 402 and 404 and three servers 408, 412, and 416 connected to the network 414. The client 404 includes an energy conservation module 406 and the server 408 includes an incentives module 409 and an energy usage module 410. According to embodiments, the energy conservation module 406 can monitor energy usage at a physical site and convey information to the server 408. The energy usage module can monitor energy usage on an electrical grid. The incentives module 409 can offer awards to VU user accounts to reduce power usage on the network 414. In practice, there may be a different number of clients and servers. Also, in some instances, a client may perform the functions of a server and a server may perform the functions of a client. Any one of the clients 402, 404 and servers 408, 412 can be embodied as the computer system described in FIG. 5.

The clients 402 and 404 can be mainframes, minicomputers, personal computers, laptops, personal digital assistants, or the like. The clients 402 and 404 may transmit data over the network 414 or receive data from the network 414 via a wired, wireless, optical, or other connection. The energy conservation module 406 may be embodied in one or more client machines, possibly including one or more of the clients 402, 404. Further, the energy conservation module 406 may be embodied in a server, such as the server 408. For instance, servers can embody functionality (e.g., as code, a processing card, etc.) that monitor energy usage at physical sites, including both client sites and server sites. Functionality for offering awards, notifying VU user accounts of energy usage, and monitoring energy greenness, production, usage, etc., can be embodied in one or more of the servers 408, 412, 416 or distributed as tasks to the clients 402, 404 accessing the virtual universe. For example, monitoring and reporting energy usage may be performed as a background task on the client machines 402, 404 distributed by any of the servers 408, 412, 416.

Example Virtual Universe Energy Conservation Computer System

Figure 5:
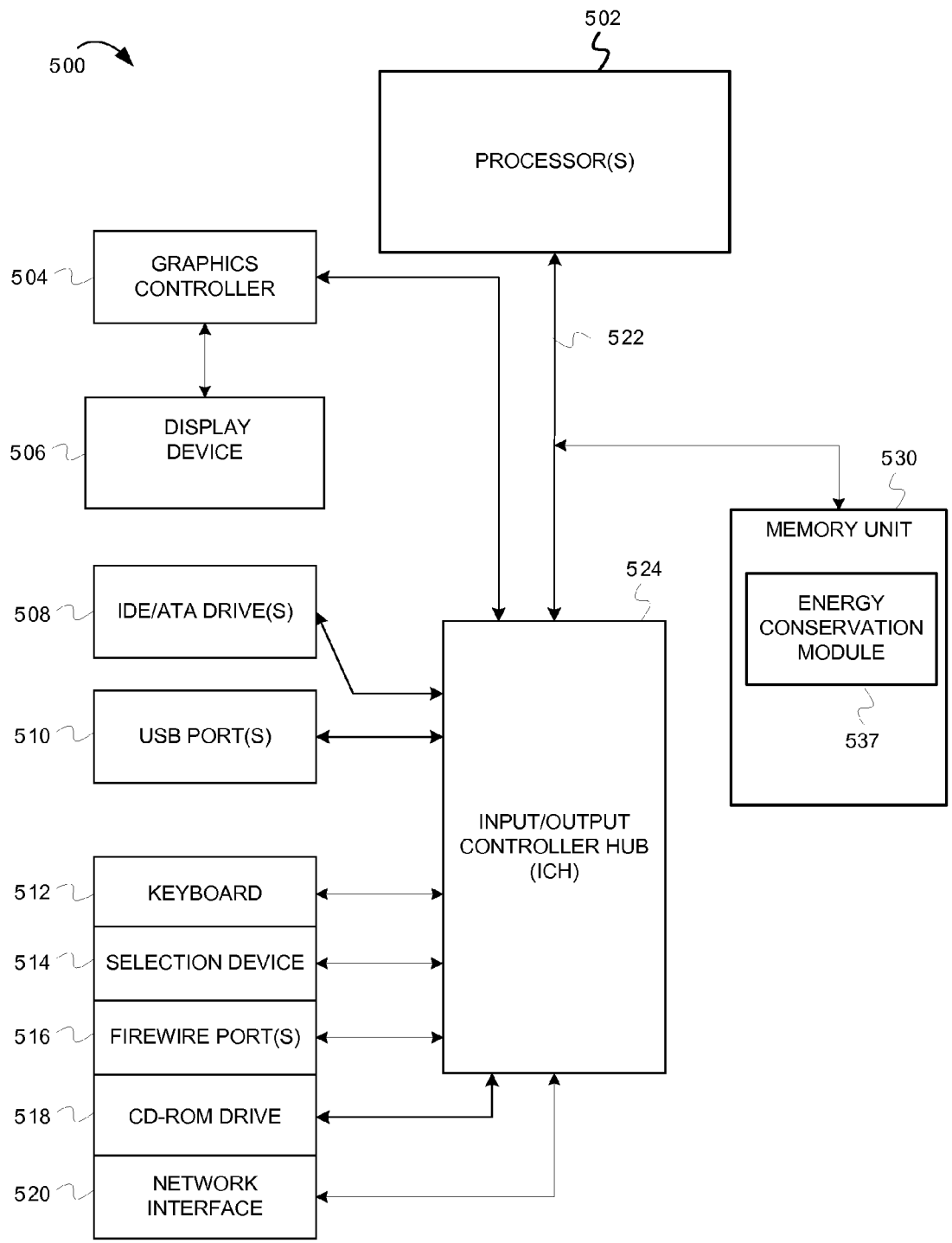
FIG. 5 illustrates an example computer system.

FIG. 5 illustrates an example computer system 500. As shown in FIG. 5, the computer system 500 may include processor(s) 502, a memory unit 530, a processor bus 522, and an Input/Output controller hub (ICH) 524. The processor(s) 502, memory unit 530, and ICH 524 may be coupled to the processor bus 522. The processor(s) 502 may comprise any suitable processor architecture. The computer system 500 may comprise one, two, three, or more processors, any of which may execute a set of instructions in accordance with some embodiments.

The memory unit 530 may also include an I/O scheduling policy unit 532 and I/O schedulers 534. The memory unit 530 can store data and/or instructions, and may comprise any suitable memory, such as a dynamic random access memory (DRAM), for example. The computer system 500 may also include IDE drive(s) 508 and/or other suitable storage devices. A graphics controller 504 controls the display of information on a display device 506, according to some embodiments.

The input/output controller hub (ICH) 524 provides an interface to I/O devices or peripheral components for the computer system 500. The ICH 524 may comprise any suitable interface controller to provide for any suitable communication link to the processor(s) 502, memory unit 530 and/or to any suitable device or component in communication with the ICH 524. The ICH 524 can provide suitable arbitration and buffering for each interface.

For one embodiment, the ICH 524 provides an interface to one or more suitable integrated drive electronics (IDE) drives 508, such as a hard disk drive (HDD) or compact disc read only memory (CD ROM) drive, or to suitable universal serial bus (USB) devices through one or more USB ports 510. For one embodiment, the ICH 524 also provides an interface to a keyboard 512, selection device 514 (e.g., a mouse, trackball, touchpad, etc.), CD-ROM drive 518, and one or more suitable devices through one or more firewire ports 516. For one embodiment, the ICH 524 also provides a network interface 520 though which the computer system 500 can communicate with other computers and/or devices.

The computer system 500 may also include a machine-readable medium that stores a set of instructions (e.g., software) embodying any one, or all, of the methodologies for indicating energy usage at a physical site through a virtual environment. Furthermore, software can reside, completely or at least partially, within the memory unit 530 and/or within the processor(s) 502. The computer system 500 can also include an energy conservation module 537. The energy conservation module 537 can process communications, commands, or other information, to monitor energy usage at a physical site and indicate the energy usage to client devices associated with the virtual environment. Any component of the computer system 500 can be implemented as hardware, firmware, and/or machine-readable media including instructions for performing the operations described herein.

Embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments of the inventive subject matter may take the form of a computer program product embodied in any tangible medium of expression having computer usable program code embodied in the medium. The described embodiments may be provided as a computer program product, or software, that may include a machine-readable medium having stored thereon instructions, which may be used to program a computer system (or other electronic device(s)) to perform a process according to embodiments, whether presently described or not, since every conceivable variation is not enumerated herein. A machine-readable medium includes any mechanism for storing or transmitting information in a form (e.g., software, processing application) readable by a machine (e.g., a computer). A machine-readable storage medium may include, but is not limited to, magnetic storage medium (e.g., floppy diskette); optical storage medium (e.g., CD-ROM); magneto-optical storage medium; read only memory (ROM); random access memory (RAM); erasable programmable memory (e.g., EPROM and EEPROM); flash memory; or other types of medium suitable for storing electronic instructions in a form that is not a propagated signal. A machine readable signal medium may include embodiments in an electrical, optical, acoustical or other form of propagated signal (e.g., carrier waves, infrared signals, digital signals, etc.).

Computer program code for carrying out operations of the embodiments may be written in any combination of one or more programming languages, including an object oriented programming language such as Java, Smalltalk, C++ or the like and conventional procedural programming languages, such as the "C" programming language or similar programming languages. The program code may execute entirely on a user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN), a personal area network (PAN), or a wide area network (WAN), or the connection may be made to an external computer (for example, through the Internet using an Internet Service Provider).

This detailed description refers to specific examples in the drawings and illustrations. These examples are described in sufficient detail to enable those skilled in the art to practice the inventive subject matter. These examples also serve to illustrate how the inventive subject matter can be applied to various purposes or embodiments. Although examples refer to energy conservation, other natural resources can be monitored and conserved. Other embodiments are included within the inventive subject matter, as logical, mechanical, electrical, and other changes can be made to the example embodiments described herein. Features of various embodiments described herein, however essential to the example embodiments in which they are incorporated, do not limit the inventive subject matter as a whole, and any reference to the invention, its elements, operation, and application are not limiting as a whole, but serve only to define these example embodiments. This detailed description does not, therefore, limit embodiments, which are defined only by the appended claims. Each of the embodiments described herein are contemplated as falling within the inventive subject matter, which is set forth in the following claims.

What is claimed is:

1. A method, comprising:
    determining comprehensive energy usage at a physical site where a client accessing a virtual universe is located;
    determining that the comprehensive energy usage at the physical site exceeds an energy usage threshold;
    notifying a virtual universe user account associated with the client that the comprehensive energy usage at the physical site exceeds the energy usage threshold; and
    awarding the virtual universe user account for conserving comprehensive energy usage at the physical site.

2. The method of claim 1, wherein awarding the virtual universe user account for conserving comprehensive energy usage at the physical site comprises:
    offering a reward to the virtual universe user account to reduce the comprehensive energy usage at the physical site for a specific time period;
    detecting a reduction in the comprehensive energy usage during the specific time period; and
    providing the reward to the virtual universe account in response to detecting the reduction in the comprehensive energy usage during the specific time period.

3. The method of claim 2, further comprising:
    determining a history of energy usage at the physical site; and
    selecting a value for the reward based on the history of energy usage.

4. The method of claim 1, wherein the energy usage threshold is associated with a period of peak energy usage.

5. The method of claim 1, wherein determining that the comprehensive energy exceeds an energy usage threshold comprises:
    determining historical energy usage for the physical site;
    associating the historical energy usage with a measurement scale;
    setting the energy usage threshold as a lower limit to a high-end range of the historical energy usage on the measurement scale;
    comparing current energy usage at the physical site with the energy usage threshold; and
    determining that the current energy usage is greater than the energy usage threshold.

6. The method of claim 1, wherein notifying the virtual user account comprises any one or more of notifying the virtual universe user account through a virtual universe interface, notifying the virtual universe user account by sending a message to a client device at the physical site, presenting an indicator within a region of the virtual universe, and communicating with an avatar associated with the virtual universe user account.

7. The method of claim 1, wherein awarding the virtual universe user account for conserving the comprehensive energy usage at the physical site comprises providing to the virtual universe user account one or more of money, credits, virtual universe items, avatar abilities, a reduction in virtual universe subscription fees, carbon credits, access to restricted areas of a virtual universe, and electronic coupons redeemable within the virtual universe.

8. A computer program product for monitoring comprehensive energy usage associated with a virtual universe, the computer program product comprising: a machine readable tangible device; first program instructions to determine that the comprehensive energy usage at a physical site where a client accessing the virtual universe is located; second program instructions to determine that the comprehensive energy usage at the physical site exceeds an energy usage threshold; and third program instructions to provide a notification to a virtual universe user account associated with the client that the comprehensive energy usage at the physical site exceeds the energy usage threshold, said notification comprising one or more of a message sent through a virtual universe interface, a message sent to a client device at the physical site using contact information stored in the virtual universe user account, an indicator presented within a region of the virtual universe, and a communication sent to an avatar associated with the virtual universe user account, and wherein the first, second and third program instructions are stored on the machine readable storage medium.

9. The computer program product of claim 8, further comprising: fourth program instructions to detect that the comprehensive energy usage at the physical site continues to exceed the energy usage threshold for a time period after the notification is provided to the virtual universe user account, and fifth program instructions to impose a penalty on the virtual universe user account, and wherein the fourth and fifth program instructions are stored on the machine readable tangible device.

10. The computer program product of claim 9, wherein the penalty is one or more of an increased virtual universe subscription fee, removal of an avatar item, and restricted access to specific locations in the virtual universe.

11. The computer program product of claim 8, further comprising: fourth program instructions to enforce an automatic reduction in the comprehensive energy usage within the virtual universe by one or more devices associated with the virtual universe, and wherein the fourth program instructions are stored on the machine readable tangible device.

12. The computer program product of claim 11, wherein the automatic reduction comprises one or more of limiting an avatar's movements in the virtual universe, reducing image quality of the virtual universe, and limiting virtual universe transactions.

13. The computer program product of claim 8, further comprising: fourth instructions to awarding the virtual universe user account for conserving comprehensive energy usage at the physical site, and wherein the fourth instructions are stored on the machine readable tangible device.

14. The computer program product of claim 8 further comprising:
  fourth instructions to present an indicator within the virtual universe, wherein the indicator indicates a reduction in the comprehensive energy usage, wherein said indicator indicates one or more of an improvement of an avatar's health, a change in an energy meter, a change in color of an indicator light within a virtual universe interface, a change in a landscape's appearance of the virtual universe, a change in a sky's color of the virtual universe, and
  wherein the fourth instructions are stored on the machine readable tangible device.

15. A system, comprising:
  a client configured to access a virtual universe at a physical site, wherein the client comprises an energy conservation module configured to
    determine comprehensive energy usage at the physical site where the client is accessing the virtual universe, and
    determine that the comprehensive energy usage at the physical site exceeds an energy usage threshold; and
  a server configured to support the virtual universe, wherein the server comprises an energy usage module configured to notify a virtual universe user account associated with the client that the comprehensive energy usage at the physical site exceeds the energy usage threshold, wherein an energy producing device at the physical site is configured to provide energy from a renewable energy source, and
  an incentives module configured to
    award the virtual universe user account for using the energy producing device.

16. The system of claim 15, wherein the energy conservation module is configured to determine comprehensive energy usage by processing any one or more of historical energy usage, current energy usage and forecast energy usage energy utilized by a plurality of devices on an electrical circuit at the physical site.

17. The system of claim 15, wherein the energy conservation module is configured to receive any one or more of energy usage data from a monitoring device that measures energy usage on an electrical circuit at any one or more of a client site and a server site, and energy usage data from an energy provider that monitors energy usage at the physical site.

18. The system of claim 15, wherein the energy conservation module is configured to
  determine historical energy usage for the physical site,
  associate the historical energy usage with a measurement scale,
  set the energy usage threshold as a lower limit to a high-end range of the historical energy usage on the measurement scale,
  compare current energy usage at the physical site with the energy usage threshold, and
  determine that the current energy usage is greater than the energy usage threshold.

19. The system of claim 15, wherein the energy usage module is configured to notify the virtual user account with any or more of an email, a text message, a chat message, an audio file, a pop-up message, an indicator light, a status bar indicator, and a virtual object.

20. The system of claim 15, wherein the incentives module is further configured to
  determine a reward to offer to the virtual universe user account based on a user preference from the virtual universe user account,
  offer the reward conditional upon reduction of the electricity usage from the electrical grid at the physical site to below the electricity usage threshold,
  detect that the electricity usage from the electrical grid at the physical site drops below the electricity usage threshold based on the use at the physical site of the energy producing device, and
  provide the reward to the virtual universe user account.

* * * * *